United States Patent
Manning et al.

(10) Patent No.: US 11,430,539 B2
(45) Date of Patent: Aug. 30, 2022

(54) MODIFIABLE REPAIR SOLUTIONS FOR A MEMORY ARRAY

(71) Applicant: Micron Technology, Inc., Boise, ID (US)

(72) Inventors: Troy A. Manning, Meridian, ID (US); Troy D. Larsen, Meridian, ID (US); Jonathan D. Harms, Meridian, ID (US); Glen E. Hush, Boise, ID (US); Timothy P. Finkbeiner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 60 days.

(21) Appl. No.: 16/914,927

(22) Filed: Jun. 29, 2020

(65) Prior Publication Data

US 2021/0407615 A1    Dec. 30, 2021

(51) Int. Cl.
*G11C 29/44* (2006.01)
*G11C 29/42* (2006.01)
*G11C 29/00* (2006.01)
*G11C 29/18* (2006.01)
*G11C 29/24* (2006.01)

(52) U.S. Cl.
CPC .............. *G11C 29/44* (2013.01); *G11C 29/18* (2013.01); *G11C 29/24* (2013.01); *G11C 29/42* (2013.01); *G11C 29/4401* (2013.01); *G11C 29/702* (2013.01); *G11C 29/789* (2013.01); *G11C 2029/1806* (2013.01); *G11C 2229/723* (2013.01)

(58) Field of Classification Search
CPC ......... G11C 29/44; G11C 29/18; G11C 29/24; G11C 29/42; G11C 29/4401; G11C 29/702; G11C 29/789; G11C 2029/1806; G11C 2229/723
See application file for complete search history.

(56) References Cited

U.S. PATENT DOCUMENTS

| 6,011,733 | A | * | 1/2000 | Fischer | G11C 29/70 365/200 |
| 6,154,851 | A | * | 11/2000 | Sher | G11C 29/72 714/5.11 |
| 2007/0115720 | A1 | * | 5/2007 | Cohen | G11C 29/846 365/185.09 |

(Continued)

*Primary Examiner* — Jay W. Radke
(74) *Attorney, Agent, or Firm* — Holland & Hart LLP

(57) ABSTRACT

Methods, systems, and devices for modifiable repair solutions for a memory array are described to support storing repair information for a memory array within the memory array itself. A memory device may include the memory array and an on-die microprocessor, where the microprocessor may retrieve the repair information from the memory array and write the repair information to repair circuitry used for identifying defective memory addresses. The microprocessor may support techniques for identifying additional defects and updating the repair information during operation of the memory array. For example, the microprocessor may identify additional defects based on errors associated with one or more memory cells of the memory array or based on testing performed on one or more memory cells of the memory array. In some cases, a host device may identify additional defects and may notify the microprocessor of the additional defects.

20 Claims, 7 Drawing Sheets

(56) References Cited

U.S. PATENT DOCUMENTS

2009/0257296 A1* 10/2009 Ong .................. G11C 29/78
                                                    365/200
2013/0227344 A1*  8/2013 Sohn ................. G11C 29/44
                                                    714/6.21
2017/0110206 A1*  4/2017 Ryu .................. G11C 29/52

* cited by examiner

MODIFIABLE REPAIR SOLUTIONS FOR A MEMORY ARRAY

BACKGROUND

The following relates generally to one or more systems for memory and more specifically to modifiable repair solutions for a memory array.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
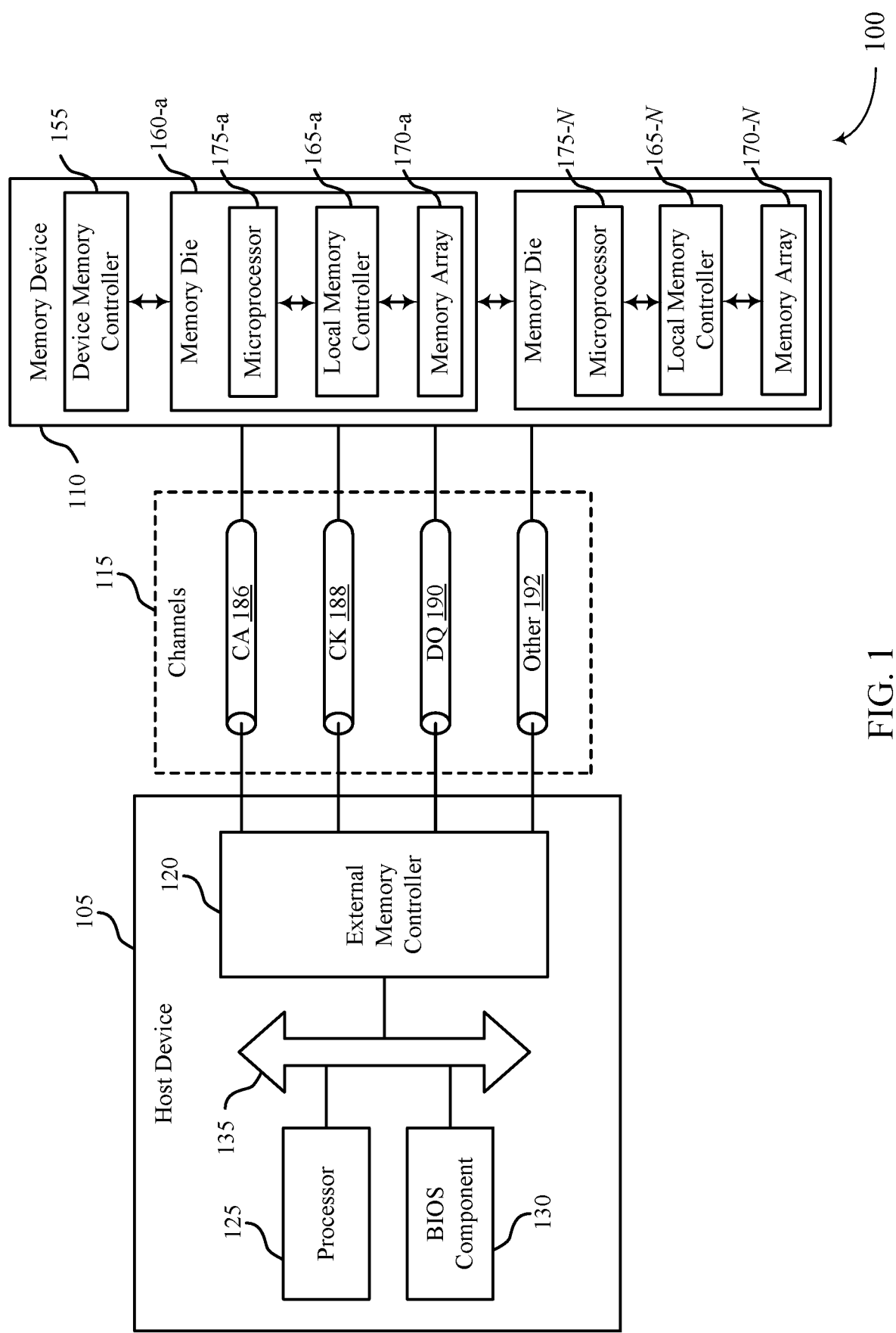
FIG. 1 illustrates an example of a system that supports modifiable repair solutions for a memory array in accordance with examples as disclosed herein.

In some cases, a memory array or memory device may be manufactured so as to include redundant (e.g., replacement, repair, extra, spare) memory cells. Repair or replacement of a defective memory cell may refer to using a redundant memory cell instead of the defective memory cell. For example, data that may otherwise be stored at the defective memory cell may instead be stored at the redundant memory cell. Access operations (e.g., read, write, refresh operations) that may otherwise be performed on the defective memory cell may instead be performed on the redundant memory cell. For example, commands or data that may be addressed to the defective memory cell may be rerouted or otherwise redirected to the redundant memory cell. Thus, even if a defective memory cell is not physically replaced or repaired, it may be functionally replaced, and the associated defect may be functionally repaired.

Some repair solutions for replacing defective memory cells of a memory device with redundant memory cells may rely on one-time programmable devices (e.g., fuses or anti-fuses) to store repair information (e.g., memory addresses of the defective cells). These one-time programmable solutions are not able to be updated or modified during operation of the device, and as such do not support repair of defects that may occur as a result of wear or device usage. Additionally, one-time programmable solutions may also consume relatively large amounts of space on a die or other memory device structure (e.g., fuses or anti-fuses may be physically large). Accordingly, storing repair information using one-time programmable solutions may decrease the longevity or reliability of a memory device, and additionally or alternatively may increase a footprint of the memory device.

If a memory device includes a non-volatile memory array (e.g., a ferroelectric memory array), repair information for the memory array may be stored in the memory array itself. The memory device may also include an on-die microprocessor, which may retrieve the repair information from the memory array (e.g., as part of a boot procedure for the die) and write the repair information to repair circuitry to support run-time comparisons of the repair information (e.g., to a set of latches, to support comparisons with addresses associated with commands received by the memory device from a host device).

In some cases, the microprocessor may support various techniques related to identifying additional defects and updating the repair information—both as stored in the memory array and as stored by the latches—during operation of the memory array. For example, the microprocessor may identify additional defects based on a quantity of errors associated with one or more memory cells of the memory array or based on testing (e.g., diagnostic procedures) performed on one or more memory cells of the memory array. Additionally or alternatively, a host device may identify additional defects of the memory array and may notify the microprocessor of the additional defects. Upon identifying or being notified of additional defects, the microprocessor may store new or updated repair information (e.g., defective memory addresses) in the memory array for future access (e.g., to program to the repair circuitry).

Storing the repair information in the memory array, and programming the information from the array to repair circuitry by the microprocessor, may increase device accuracy, reliability, and speed, as well as decrease a footprint of the memory device (e.g., by reducing or eliminating one-time programmable repair information and related structures). While examples of the techniques and apparatuses described herein may be described with reference to ferroelectric memory, it is to be understood that similar techniques and apparatuses for storing repair information in a memory array and accessing the repair information using an on-die microprocessor may be applied in the context of other types of non-volatile memory.

Features of the disclosure are initially described in the context of systems and dies as described with reference to FIGS. 1-2. Features of the disclosure are described in the context memory die architecture and repair circuitry as described with reference to FIGS. 3 and 4. These and other features of the disclosure are further illustrated by and described with reference to an apparatus diagram and flowcharts that relate to modifiable repair solutions for a memory array as described with reference to FIGS. 5-7.

FIG. 1 illustrates an example of a system 100 that supports modifiable repair solutions for a memory array in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110). As described herein, a memory device 110 may include one or more microprocessors 175 on a same die 160 as a memory array 170.

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a graphics processing unit (GPU), a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. A memory die 160 may be a semiconductor die. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105—which may be referred to as user data—or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

In some cases, a memory die 160 may include one or more microprocessors 175. For example, a memory die 160 may include one microprocessor 175, one microprocessor 175 per bank of a memory array 170, or some other configuration. Some information associated with defective memory addresses of a memory array 170 (that is, memory addresses of defective memory cells) within a memory die 160 may be stored on-die (e.g., within the same memory array 170), such that the repair information may be accessed by an on-die microprocessor 175. For instance, some repair information may be stored in a memory array 170 of the memory die 160 (e.g., a non-volatile memory array, such as an FeRAM memory array, as one example). During a boot or start-up procedure (e.g., or at another time) the microprocessor 175 may access the repair information stored in the memory array 170 and may program the repair information into repair circuitry associated with the memory array 170. As one example, addresses corresponding to defective (or alternatively, repaired) memory cells may be stored in the memory array 170 and the repair circuitry may be configured to compare an address received from the host device 105 with one or more defective memory cell addresses stored by the memory array 170.

In some cases, additional data associated with the microprocessor 175, such as data related to monitoring and managing the performance and operation of the memory array 170, and which may be inaccessible to the host device 105 (e.g., outside an address space that is addressable by the host device 105 via command and address (CA) channels 186 (which may alternatively be referred to as a CA bus), may also be stored in the memory array 170. In some cases, some or all of the structures or functions ascribed herein to a local memory controller 165, device memory controller 155, or other controller described herein as possibly included in a memory device 110 may instead be included in or performed by the microprocessor 175, and thus a memory device 110 may or may not include any separate controller.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more CA channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The host device 105 may use one or more channels 115 (e.g., one or more CA channels 186) to transmit a command to the memory device 110 that includes or is otherwise associated with a memory address. The command may be, for example, to perform an access (e.g., read or write) operation at the memory address. In some cases, the memory address may correspond to a defective set of one or more memory cells and thus may be referred to as a defective (or alternatively, repaired) memory address. Information regarding the defective memory address may have been previously stored at a memory array 170 associated with the memory address (e.g., or at another memory array 170), and such information may be an example of repair information. An associated microprocessor 175 may have previously programmed the information regarding the defective memory address into repair circuitry associated with the memory array 170 that includes the memory address (e.g., may program the information at start-up). Accordingly, the memory device 110 may receive the command from the host device 105, and may identify (e.g., using the repair circuitry) the memory address as a defective memory address based on the repair information previously programmed into the repair circuitry. Based on identifying the memory address as a defective memory address, the memory device 110 may access a different set of one or more memory cells, such as one or more repair memory cells, to perform the command.

In some cases, the host device 105 may identify or update information regarding one or more defective memory addresses and may transmit an indication of the information to the memory device 110, such that the memory device 110 may store the information in a memory array 170 or may update repair information already stored at the memory array 170. For example, the host device 105 may transmit an indication of the information via one or more channels 115, such as one or more CA channels 186.

Figure 2:
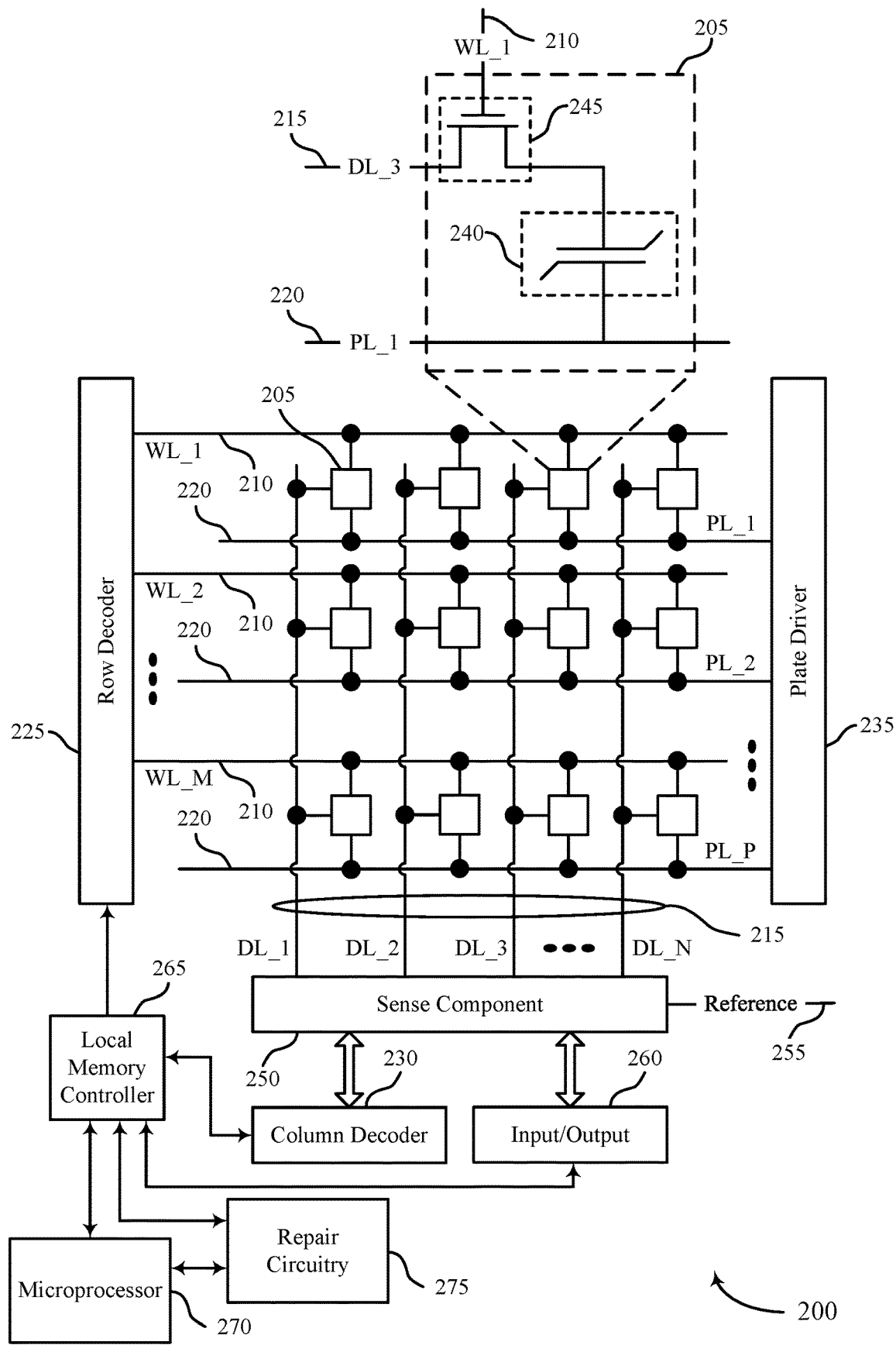
FIG. 2 illustrates an example of a memory die that supports modifiable repair solutions for a memory array in accordance with examples as disclosed herein.

FIG. 2 illustrates an example of a memory die 200 that supports modifiable repair solutions for a memory array in accordance with examples as disclosed herein. The memory die 200 may be an example of a memory die 160 as described with reference to FIG. 1 and may be referred to as a memory device or memory devices. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1. The array may be referred to as a memory device or memory devices. The memory die 200 may include one or more microprocessors 270, each of which may be an example of a microprocessor 175 as described with reference to FIG. 1.

Certain examples described herein are described in the context of an FeRAM memory array, but it is to be understood that the teachings herein may be applied in the context of any kind of memory array, with FeRAM being just one illustrative possibility. Where memory cells 205 are ferroelectric memory cells, a memory cell 205 may store a state (e.g., polarization state or dielectric charge) representative of the programmable states in a capacitor. For example, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

Memory die 200 may also include one or more microprocessors 270, which in some cases may be coupled with the local memory controller 265. Additionally or alternatively, the microprocessor may be coupled with any other aspect of the memory die 200 (e.g., row decoder 225, column decoder 230, plate driver 235, input/output 260). In some cases, some or all of the structure or functions ascribed herein to local memory controller 265 may instead be included in or performed by microprocessor 270 (e.g., local memory controller 265 may be absent in some implementations).

The microprocessor 270 may, for example, monitor and potentially manage one or more aspects of the performance or operation of the array of memory cells 205, in accordance with the examples described herein. A subset of the memory cells 205 in the array may be used to store, for the microprocessor 270, repair information associated with defective memory cells 205 of the memory die 200 (e.g., addresses corresponding to defective memory cells 205). For instance, the microprocessor 270 may operate to cause the memory die 200 to store (e.g., write, program) the repair information in one or more rows of memory cells 205 (each row coupled with a respective word line 210).

In some cases, the rows of memory cells 205 used to store the repair information for the microprocessor 270 may be skip rows and may be available for such use due at least in part to a wear leveling procedure for the array. For example, during operation of the array and the memory die 200, the wear leveling procedure may (e.g., periodically or on an otherwise scheduled or commanded basis) rotate the storage location of data within the array to equalize (normalize, balance, even, level) the amount of wear associated with different memory cells 205 within the array. Thus, in some cases the physical location at which the operating code and/or other data for the microprocessor 270 may vary (rotate, change) over time as the array is operated, in accordance with the wear leveling procedure.

The microprocessor 270 may further operate to identify and access the repair information stored in the die 200 and to program the repair information into repair circuitry 275 of the memory die 200. For example, the microprocessor 270 may access and program the repair information during a boot or start-up procedure (e.g., or at another time). As one example, addresses corresponding to defective memory cells may be retrieved from the memory array and programmed to the repair circuitry 275, and the repair circuitry 275 may be configured to compare an address received from a host device with the defective memory cell addresses. For example, the repair circuitry 275 may include some quantity of latches that the microprocessor 270 may program to store the repair information, and the repair circuitry 275 may also include comparison circuitry configured to compare memory addresses associated with access operations (e.g., memory addresses received from a host device) with the defective memory addresses associated with the repair information. If the repair circuitry 275 identifies a received memory address as a defective memory address, the memory die 200 (e.g., the local memory controller 265, the row decoder 225, and/or column decoder 230) may access a different set of one or more memory cells than a set associated with the received memory address, such as one or more redundant memory cells rather than one or more defective memory cells.

Figure 3:
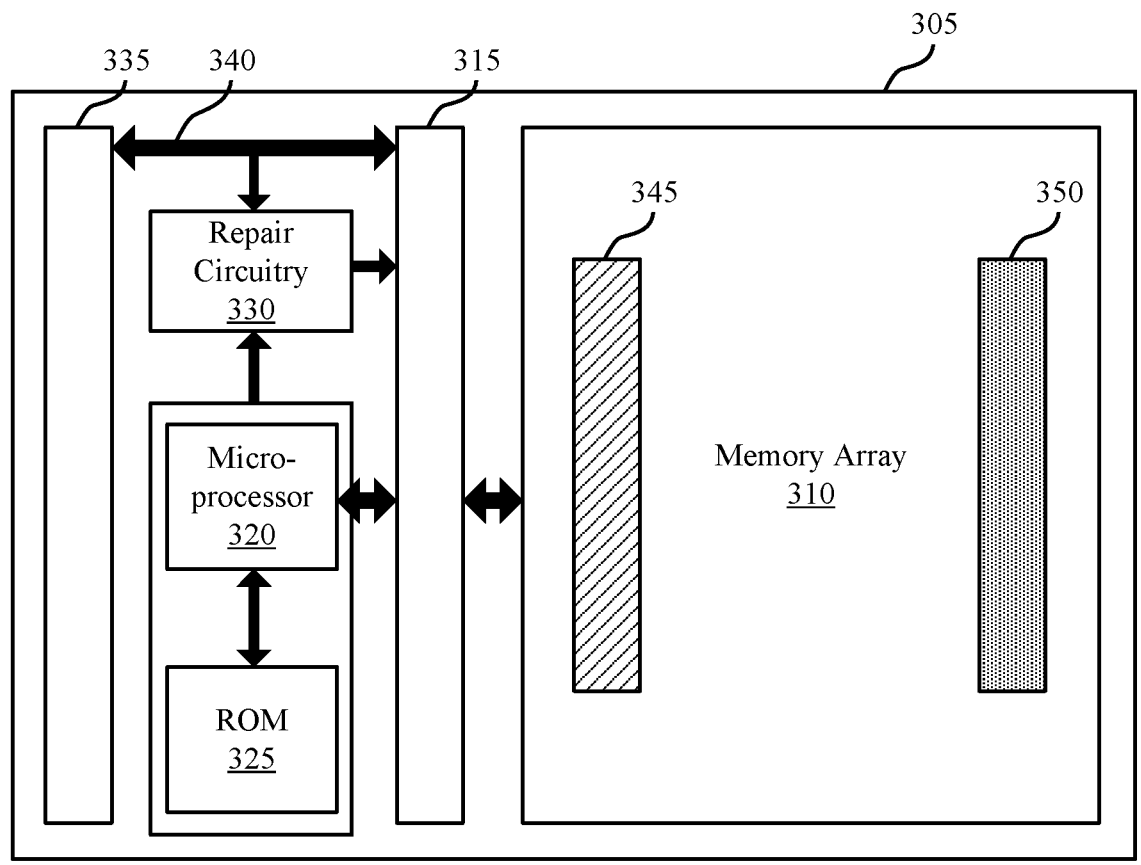
FIG. 3 illustrates an example of a memory die architecture that supports modifiable repair solutions for a memory array in accordance with examples as disclosed herein.

FIG. 3 illustrates an example of a memory die architecture 300 that supports modifiable repair solutions for a memory array in accordance with examples as disclosed herein. Memory die architecture 300 may include a memory die 305, which may be an example of aspects of a memory die 160 as described with reference to FIG. 1 or a memory die 200 as described with reference to FIG. 2. In some examples, memory die 305 may be an example of a semiconductor (e.g., silicon) memory die or any other type of memory device as described herein.

Memory die 305 may include a memory array 310, which may be an example of aspects of a memory array 170 as described with reference to FIG. 1, or an array as described with reference to FIG. 2. The memory array 310 may be a collection (e.g., one or more grids, one or more banks, one or more tiles, one or more sections) of memory cells, with each memory cell being operable to store at least one bit of data. In cases where the memory array includes one or more banks, each of the one or more banks may include one or more subarrays.

Memory die 305 may also include a controller 315 coupled with the memory array 310. The controller 315 may be an example of aspects of a device memory controller 155 or a local memory controller 165 as described with reference to FIG. 1, or a local memory controller 265 as described with reference to FIG. 2. The controller 315 may be operable to control operation of the memory array 310. For example, the controller 315 may be operable to access one or more memory cells in response to a command received from a source external to the memory die 305 (e.g., a host device 105), and may in some cases, represent an access component. Controller 315 may also include or be coupled with decoding circuitry, such as one or more row decoders 225, column decoders 230, or plate drivers 235 as described with reference to FIG. 2, or a command decoder for decoding commands received from a source external to the memory die 305.

The controller 315 may be coupled with a bus 340 via which the controller 315 may receive data from and transmit data to a source external to the memory die 305 (e.g., a host device 105). The bus 340 may also carry commands (e.g., access commands) and address information associated with the data. The controller 315 may be operable to store the data received via the bus 340 in a subset of the memory array 310 (e.g., a subset of the memory cells within the memory array 310). The bus 340 may be coupled with one or more pads 335 included in the memory die 305. The pads 335 may be coupled (e.g., via pins, balls, bond pads, bond wires, or any other type of interconnect, or any combination thereof) with any quantity of electrically conductive materials that may be associated with communication channels 115 as described with reference to FIG. 1, including DQ channels 190 and CA channels 186, among other examples.

The subset of the memory array 310 for storing data received via the bus 340 may be associated with a logical address space, where commands associated with the data may reference logical addresses within the logical address space to identify or otherwise associate the commands with corresponding data. For example, a read or write command may include or otherwise be associated with (e.g., received concurrently or with some other defined timing relative to) a logical address, and the controller 315 may identify a location within memory array 310 for reading or writing the data for the command based on the logical address. Physical storage locations within the memory array 310 (e.g., banks, subarrays, rows, columns, memory cells) may each have a respective physical address within a physical address space, and the controller 315 may maintain and utilize a logical-to-physical (L2P) address mapping to correlate logical addresses with physical addresses within the memory array 310. In some cases, logical addresses may alternatively be referred to as virtual addresses, and the logical address space may alternatively be referred to as a virtual address space.

In some cases, the physical address space associated with the memory array 310 may be larger than the logical address space associated with the commands and data exchanged over the bus 340 (e.g., the logical address space used by a host device 105). For example, a first subset of physical locations within the memory array 310 may have physical addresses for which a corresponding logical address exists within the logical address space, such that memory cells within the first subset of physical locations of the memory array 310 may be accessible to a device external to the memory die 305 (e.g., to a host device 105) and may be available to store data.

A second subset of physical locations within the memory array 310 may have physical addresses for which no corresponding logical address exists within the logical address space, and this second subset of physical locations within the memory array 310 may not be accessible to a device external to the memory die 305 (e.g., to a host device 105). In some cases, memory cells within the second subset of physical locations may be configured to store repair information associated with one or more defective memory addresses (e.g., memory cells, rows, banks) of the memory array 310. For example, a portion 345 (e.g., one or more rows) of the memory array 310, which may be within the second subset of physical locations, may be dedicated or configured to store the repair information.

In some cases, the second subset of physical locations may also include repair cells for replacing one or more defective memory cells of the memory array 310. For example, a portion 350 (e.g., one or more rows) of the memory array 310, which may be within the second subset of physical locations, may include redundant memory cells (e.g., redundant rows) configured to replace defective memory cells within the first subset of physical locations within the memory array 310.

The memory die 305 may also include a microprocessor 320. In some examples, the microprocessor 320 may include or be an example of a central processing unit (CPU). The microprocessor 320 may be configured to execute instructions. Executable instructions for the microprocessor 320 may be referred to as operating code for the microprocessor 320. In some cases, the microprocessor 320 may be coupled with ROM 325, where the ROM 325 may store the operating code (e.g., firmware) for the microprocessor 320. In some cases, the memory array 310 may additionally or alternatively store all or some of the operating code for the microprocessor 320. The microprocessor 320 may execute operating code or instructions, for instance, to monitor and manage (control) various operational aspects of the memory array 310 or other aspects of the memory die 305. In some cases, the microprocessor may be coupled with the pads 335 and may be configured to exchange signals with a device external to the memory die 305 (e.g., a host device 105) via the pads 335.

Additionally or alternatively, the microprocessor may be coupled with the controller 315, as shown in the example of FIG. 3, and in some cases, the microprocessor 320 may be directly coupled with the memory array 310. For example, one or more structures or functions ascribed herein to the controller 315 may instead be included in or performed by the microprocessor 320, and in some cases a memory die 305 may lack a controller 315. Though one microprocessor 320 is shown in the example of FIG. 3, it is to be understood that in some cases a memory die 305 may include multiple microprocessors 320 (e.g., one on-die microprocessor 320 per bank of a memory array 310, or one on-die microprocessor 320 per memory array 310 of a memory die 305 that includes multiple memory arrays 310).

A microprocessor 320 within the memory die 305 may support a wide variety of functions, as may be appreciated by one of ordinary skill in the art. For instance, a microprocessor 320 may be configured to identify and read (e.g., access) repair information from the second subset of physical locations in the memory array 310. In some cases, the microprocessor 320 may also be configured to write the repair information to the memory array 310, or another component of the memory die 305 may be configured to write the repair information to the memory array 310. The repair information may be associated with defective memory addresses of the memory array 310 (e.g., defective memory cells). For example, the microprocessor 320 may be configured to read (e.g., obtain) the repair information from a portion 345 of the memory array 310, validate the repair information, and program the repair information (e.g., bit by bit) into one or more components of repair circuitry 330 (e.g., so the repair circuitry may later perform real-time comparisons between the repair information and addresses associated with commands and data received from an external device, such as a host device). In some cases, the microprocessor 320 may access and program the repair information during a startup of a memory device (e.g., as part of a boot procedure or a boot event). In some cases, multiple copies of the repair information may be stored in the memory array 310 (e.g., for redundancy in case of information failure). The microprocessor 320 may be coupled with the repair circuitry 330 in order to perform one or more of the functions described herein. The repair circuitry 330 may be also coupled with the controller 315, as illustrated by FIG. 3.

Validating the repair information (e.g., by the microprocessor 320 before the repair information is programmed to the repair circuitry 330) may include validating a cyclic redundancy check (CRC) or other type of error checking code (ECC) that is associated with the repair information. For example, the repair information may be stored in the memory array 310 in association with a CRC or other type of ECC. If the microprocessor 320 identifies one or more errors based on the validating, the microprocessor 320 may attempt to correct the one or more errors and program corrected repair information into the repair circuitry 330 (e.g., to an extent supported by the ECC).

The repair circuitry 330 may compare the repair information with information received from an external device (e.g., via a command from a host device). For example, the repair information may include one or more memory addresses for memory cells of the memory array 310 that are defective (e.g., unusable, unsuitable) for memory storage, and the repair circuitry 330 may be configured to compare the one or more defective memory addresses with an address received from an external source (e.g., via a command). If the received address does not match any of the one or more defective memory addresses, the repair circuitry 330 may be configured to indicate the lack of a match (or to not indicate a match) to the controller 315 or to the microprocessor 320, and the controller 315 or to the microprocessor 320 may access non-repaired memory cells within the memory array 310 (e.g., from the first subset of physical locations) that are associated with the received address. If, however, the received address matches one of the one or more defective memory addresses, the repair circuitry 330 may be configured to indicate the match to the controller 315 or the microprocessor 320, and the controller 315 or the microprocessor 320 may instead access one or more redundant memory cells (e.g., from the portion 350) that have been configured to replace memory cells associated with the received address but identified as defective.

For example, a logical address received via a command or operation may have at some first time been associated with a first set of one or more memory cells having a first physical address within the physical address space. The first set of one or more memory cells may have at some second time been identified as defective, however, and thus a second set of one or more memory cells having a second physical address within the physical address space (e.g., a second set of one or more memory cells within the portion 350) may have been configured to replace the first set of one or more memory cells. The received logical address may be mapped to the first physical address (e.g., via an L2P mapping) and the first physical address for the defective cells may be passed to the repair circuitry 330. The repair circuitry 330 may be configured to determine that the first physical address (and thus the command or operation) is associated with a defective set of memory cells, for example, by comparing the first physical address with one or more memory addresses included in the repair information and thus previously programmed to the repair circuitry 330 by the microprocessor 320.

When a command or operation received via the bus 340 is associated with a defective set of memory cells, the repair circuitry 330 may be configured to cause one or more replacement (e.g., redundant) memory cells (e.g., within the portion 350) to be accessed instead of the defective set of memory cells. In some cases, the repair circuitry 330 may determine the address of the replacement memory cells, which may be referred to as a repair address, and indicate the repair address to the controller 315 or the microprocessor 320. In some cases, the repair circuitry 330 may indicate to the controller 315 or the microprocessor 320 that the command or operation is associated with a defective set of memory cells (e.g., indicate a match as described elsewhere herein), and the controller 315 or the microprocessor 320 may determine the repair address based on the indication from the repair circuitry 330 (e.g., in conjunction with the received address).

In some cases, the repair address may be a physical address (e.g., memory cell address, memory row address, or other address within the physical address space for the memory array 310) of one or more memory cells configured to replace one or more defective memory cells. For example, the repair address may be for one or more memory cells within the portion 350 of the memory array 310. In some cases, the repair circuitry 330 and the controller 315 and/or microprocessor 320 may be configured to relocate data from a repaired memory cell to a corresponding replacement memory cell.

In some cases, one or more defective memory cells may be identified during fabrication or as a part of post-fabrication testing (e.g., pre-deployment testing). In such cases, corresponding repair information (e.g., addresses) for one or more defective memory cells may be pre-loaded into portion 345 of the memory array 310. For example, the one or more identified defective memory addresses may be stored in portion 345 of the memory array 310.

The microprocessor 320 may additionally be configured to perform in-field updates or changes to the repair information stored in portion 345. For example, the microprocessor 320 may have access to the repair circuitry 330, the repair information, and information regarding failures within the memory array 310. The microprocessor 320 may analyze repair circuitry 330, the repair information, and/or the array failure information, and may determine updated or new repair information based on the analysis (e.g., may determine one or more new defective memory addresses). The microprocessor 320 may, for example, use on-board ECC associated with the memory array 310 to detect one or more memory cell errors and may update the repair information based on the detected memory cell error(s) (e.g., the ECC detection may trigger an update of the repair information). For example, the microprocessor may identify that a quantity of detected ECC errors (e.g., over a period of time) for a memory address of the memory array 310 (e.g., a memory cell) satisfies a threshold quantity of errors and may update the repair information to reflect that the memory address is defective. The microprocessor 320 may program any updated repair information to the memory array 310 using the portion 345 of the memory array 310.

In some cases, the microprocessor 320 may be configured to perform testing on the memory array 310, or a portion thereof (e.g., on one or more cells of the memory array 310), in order to identify new repair information. For example, the microprocessor 320 may perform stress-testing on the memory array 310, or a portion thereof, by performing an access operation on the memory array 310 (e.g., using an access component, such as controller 315) and altering one or more parameters of the access operation (e.g., via the access component), such as one or more voltage or timing variances. The alteration of such parameters may increase a likelihood of an error on a memory cell of the memory array 310 during the access operation, where the likelihood may be higher if the memory cell is closer to failing or becoming defective (e.g., if the memory cell is a "weak" memory cell). If one or more of the parameters falls outside of a margin of error during the access operation, or if an error is detected during the access operation with the altered parameters, the microprocessor 320 may identify the associated memory cell as a weak memory cell. In some cases, the microprocessor 320 may perform such testing on the memory array 310 during refresh intervals for the memory array 310 (e.g., during time periods allotted for refreshing some or all memory cells within the memory array 310), during maintenance intervals for the memory array 310 (e.g., periodic or otherwise recurring time periods allotted for various maintenance or management functions), or otherwise when the memory array 310 is in an idle or stand-by mode or unavailable for access by a host device 105.

Performing such testing may support identification, by the microprocessor 320, of one or more memory cells of the memory array 310 that are closer to failing or becoming defective (e.g., may support identification of one or more weak memory cells). Based on the identification of the one or more weak memory cells, the microprocessor 320 may update the repair information to include the one or more weak memory cells and in some cases, to include one or more memory cells for repairing the one or more weak memory cells.

In some cases, an external source (e.g., a host device, such as a computer or a supercomputer) may detect one or more weak memory cells or one or more defective memory cells and may notify the microprocessor 320 of such (e.g., via the pads 335 and the bus 340). A host device, such as a supercomputer or other device with more powerful processing capabilities than the microprocessor 320, may, for example, detect one or more weak memory cells or one or more defective memory cells using a chip kill feature, higher-level ECC, multiple modes of information redundancy, or the like. After receiving the notification from the external source of the one or more weak memory cells or one or more defective memory cells, the microprocessor 320 may update the repair information stored within the memory array 310, as described herein. For example, the microprocessor 320 may update the repair information to include the one or more weak memory cells or one or more defective memory cells, as well as, in some cases, corresponding repair cells.

As described herein, the repair information may be stored in the memory array 310, along with other data (e.g., data received and associated with commands from a device external the memory die 305, such as data received via bus 340). The repair information may be stored to physical locations within the memory array 310, such as portion 345 of the memory array 310, that are outside of a logical address space for user data (e.g., associated with the bus 340), at least under an operative L2P address mapping. For example, the repair information may be stored within one or more skip rows associated with wear leveling procedures for the memory array 310 (e.g., the one or more skip rows may be included in portion 345 of the memory array 310).

Storing the repair information in the memory array 310, such that the repair information may be accessible to the microprocessor 320, may result in one or more advantages. For example, as described herein with reference to FIG. 4, storing the repair information in the memory array 310 may reduce a footprint of the repair circuitry 330 and the memory device. Additionally, storing the repair information at the memory array 310 may support in-field modification of the repair information, which may increase reliability, accuracy, and overall processing speed of the memory device. One of ordinary skill in the art may appreciate additional benefits. Because the memory array 310 and the microprocessor 320 are both fabricated to be included in the same memory die 305, one or more fabrication processes (e.g., steps) or structures may be common to the memory array 310 and the microprocessor 320, which may provide manufacturing efficiencies, performance benefits, or any combination thereof. For example, one or more metal layers may be fabricated and processed (e.g., patterned) concurrently to create electrodes at the same layer of the memory die 305 within both the memory array 310 and the microprocessor 320.

Figure 4:
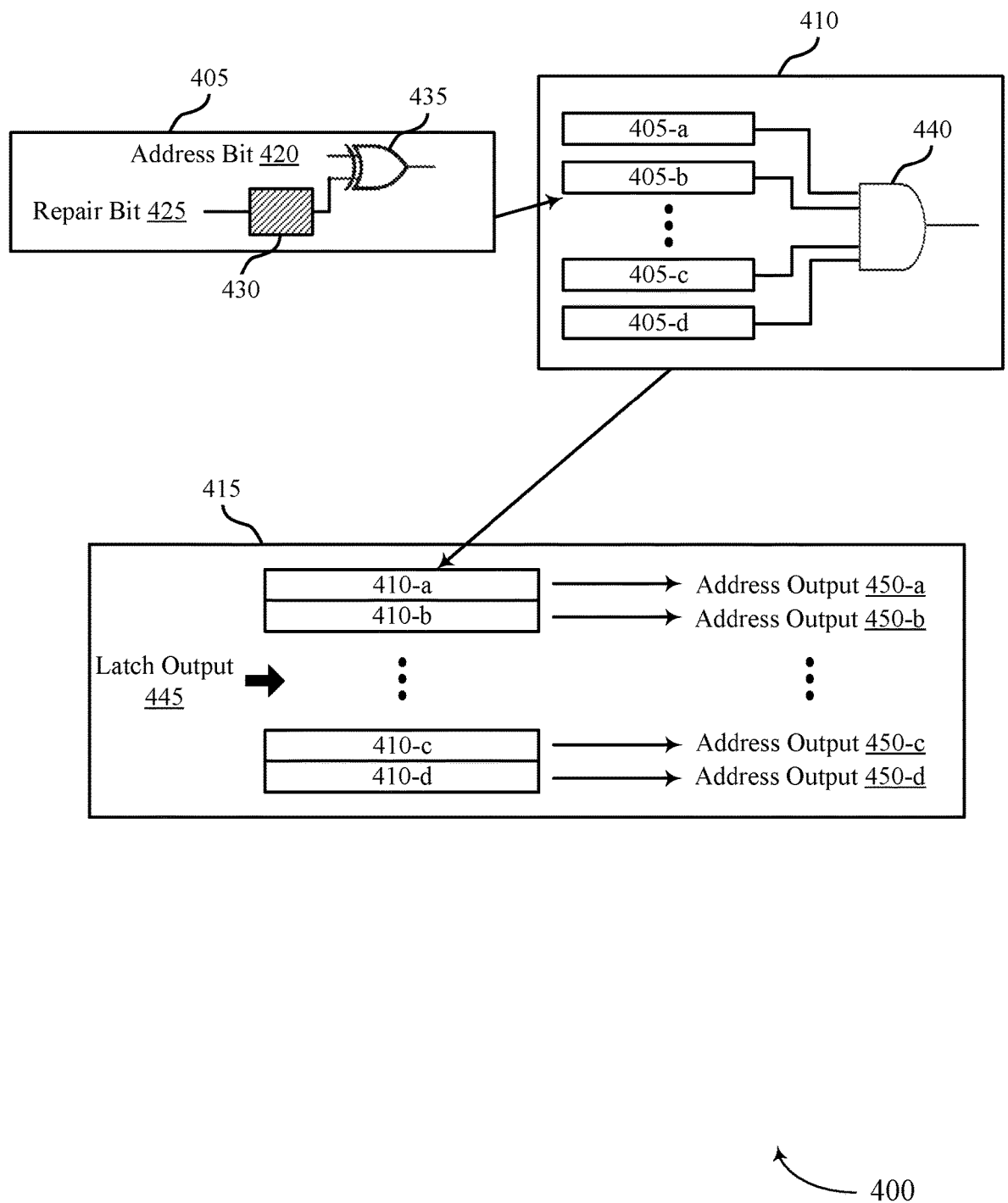
FIG. 4 illustrates an example of repair circuitry that supports modifiable repair solutions for a memory array in accordance with examples as disclosed herein.

FIG. 4 illustrates an example of repair circuitry 400 that supports modifiable repair solutions for a memory array in accordance with examples as disclosed herein. Repair circuitry 400 may represent an example of repair circuitry 330 as described herein, for example, with reference to FIG. 3. Repair circuitry 400 may be included on a memory die of a memory device, which may be an example of aspects of a memory die 160 as described with reference to FIG. 1, a memory die 200 as described with reference to FIG. 2, or a memory die 305 as described with reference to FIG. 3. Repair circuitry 400 may be coupled with or included within a controller, such as a device memory controller 155 or a local memory controller 165 as described with reference to FIG. 1, a local memory controller 265 as described with reference to FIG. 2, or a controller 315 as described with reference to FIG. 3.

Repair circuitry 400 may be coupled with a memory array (e.g., via a controller or a microprocessor), which may be an example of aspects of a memory array 170 as described with reference to FIG. 1, an array as described with reference to FIG. 2, or a memory array 310 as described with reference to FIG. 3. Repair circuitry 400 may also be coupled with a microprocessor, such as a microprocessor 320 as described with reference to FIG. 3. The microprocessor may be configured to obtain and read (e.g., access) repair information from the memory array that may be associated with one or more defective memory cells of the memory array. The repair information may, for example, be or include addresses of one or more defective memory cells. The microprocessor may be configured to read the repair information from the memory array and program the repair information (e.g., bit by bit) into repair circuitry 400.

For example, for each memory cell identified as defective, the microprocessor may program a corresponding address (e.g., a corresponding physical address) into repair circuitry 400. The corresponding address may be referred to as a repair address, and each repair bit 425 (bit within a repair address) may be programmed into a respective latch/compare circuit 405 of repair circuitry 400. Each latch/compare circuit 405 may include a latch 430, into which a repair bit 425 may be programmed by the microprocessor. Each latch/compare circuit 405 may also include an compare circuit 435 (e.g., an exclusive or (XOR) circuit), which may compare the latched repair bit 425 with an address bit 420 from an external source (e.g., corresponding to an access address received from a host device). The latch/compare circuit 405 may output a signal indicative of a result of the comparison (e.g., from the compare circuit 435), which thus may indicate whether the repair bit 425 matches the address bit 420. For example, if the repair bit 425 matches the address bit 420, the latch/compare circuit 405 may output a signal having a first logic value, and if the repair bit 425 does not match the address bit 420, the latch/compare circuit 405 may output a signal having a second logic value.

The address bit 420 may be associated with a command received from the external source, where the command may include an address having multiple address bits (e.g., and in some cases, the command may include multiple addresses having multiple address bits). For example, a command may include a column address or a row address that includes a quantity of bits (e.g., 15 bits). The address bits 420 of a received address (e.g., a received logical address, or a physical address associated with a received logical address such as via an L2P mapping) may be programmed, individually, into respective latches 430, such that one address may be associated with a subset of latch/compare circuits 405 of the repair circuitry 400. The output of a latch/compare circuit 405 may therefore correspond to a comparison result for one bit of a received address, and the output of the subset of latch/compare circuits 405 (e.g., multiple latch/compare circuits 405) may correspond to a set of comparison results for the received address. The outputs of the subset of latch/compare circuits 405 may be compared or otherwise evaluated using a respective address compare circuit 410.

An address compare circuit 410 may include multiple latch/compare circuits 405 (e.g., a subset of the latch/compare circuits 405) and may compare or otherwise evaluate the output of each of the latch/compare circuits 405, for example, using an address match indicator circuit 440 (e.g., an AND circuit). The address compare circuit 410 may output a result of the evaluation (e.g., from the address match indicator circuit 440), which may indicate whether the defective address matches the received address. For example, if any of the respective defective address bits 425 does not match a respective address bit 420, the address compare circuit 410 may output a negative result (e.g., a signal having a first logic value), and if each respective repair bit 425 matches a respective address bit 420, the compare circuit 410 may output a positive result (e.g., a signal having a second logic value).

As illustrated by repair system 415, the output from corresponding latch/compare circuits 405 (e.g., latch output 445) may be compared using respective address compare circuits 410, which may each create a respective address output 450. Based on the address output 450 of a respective address compare circuit 410, the memory device may access one or more replacement memory cells corresponding to a repair address, for example, in order to carry out a received command.

If the address output 450 indicates that the received address matches a defective memory address (e.g., if the address output 450 indicates a match or a value of '1'), the memory device may access or activate one or more replacement memory cells (e.g., a replacement row) associated with a repair address instead of one or more defective memory cells associated with the received address. If the address output 450 indicates that the received address does not match a defective memory address (e.g., if the address output 450 indicates no match or a value of '0'), the memory device may access or activate memory cells associated the received address and that have not been previously identified as defective.

The repair circuitry 400 may include any quantity of address compare circuits 410 that may each be configured to compare a received address with a respective defective memory address. For example, a memory device may include one address compare circuit 410 for each row of memory within a memory array. In some cases, programming the repair information by the microprocessor into the repair circuitry 400 as described herein may reduce a footprint of the associated memory device. For example, programming the repair information into the repair circuitry may eliminate or reduce a quantity of hard-coded bits of repair information included in the repair circuitry 400, which may each, for example, represent one or more fuses or anti-fuses. Such hard-coded information and associated circuitry may be relatively large, such that reducing the amount of hard-coded information may reduce a device footprint.

While FIG. 4 illustrates one example of repair circuitry 400 for processing repair information from a microprocessor, it is to be understood that the microprocessor described herein may program repair information into any configuration of repair circuitry without departing from the scope of the present disclosure. For example, a microprocessor may program repair information into repair circuitry including one or more aspects of repair circuitry 400 or repair circuitry that is not associated with aspects of repair circuitry 400. In some cases, the microprocessor may program repair information into a controller or other circuitry of a memory die or a memory device without departing from the scope of the present disclosure.

Figure 5:
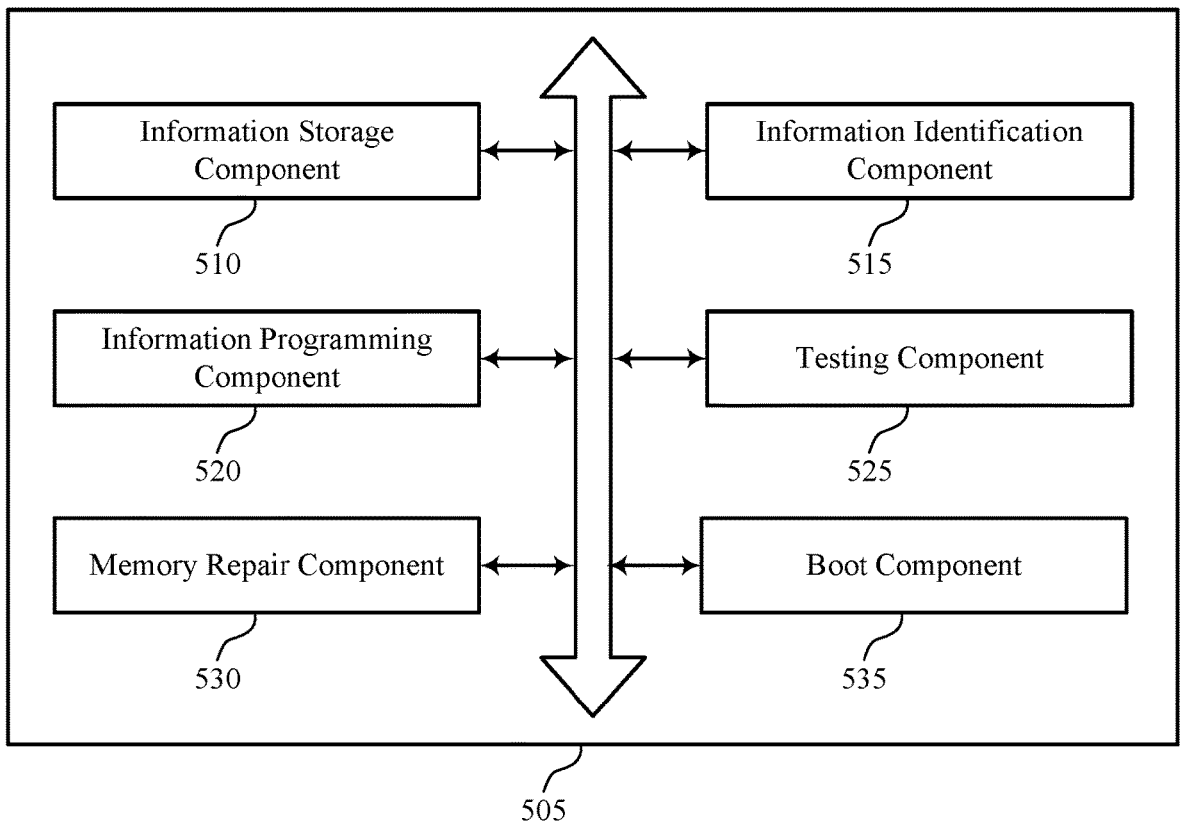
FIG. 5 shows a block diagram of a memory device that supports modifiable repair solutions for a memory array in accordance with examples as disclosed herein.

FIG. 5 shows a block diagram 500 of a memory device 505 that supports modifiable repair solutions for a memory array in accordance with examples as disclosed herein. The memory device 505 may be an example of aspects of a memory device as described with reference to FIGS. 1-4. The memory device 505 may include an information storage component 510, an information identification component 515, an information programming component 520, a testing component 525, a memory repair component 530, and a boot component 535, some or all of which may be included within a microprocessor as described herein. Each of these modules may communicate, directly or indirectly, with one another (e.g., via one or more buses).

The information storage component 510 may cause the memory device 505 to store, within a memory array, information for repairing a defect of the memory array. For example, the information storage component 510 may cause the memory device 505 to write, to the memory array, the information for repairing the defect of the memory array. In some examples, the information storage component 510 may cause the memory device 505 to store, within the memory array, new information for repairing a second defect of the memory array. In some examples, the information storage component 510 may cause the memory device 505 to store, within the memory array, a second copy of the information for repairing the defect of the memory array.

The information identification component 515 may identify, by a microprocessor on a same die as the memory array, the information for repairing the defect associated with the memory array. For example, the information identification component 515 may cause the memory device 505 to read, from the memory array, by the microprocessor on the same die as the memory array, the information for repairing the defect of the memory array. In some examples, the information identification component 515 may identify, by the microprocessor and after programming the information for repairing the defect to a set of latches, the new information for repairing the second defect of the memory array. In some examples, the information identification component 515 may receive, by the microprocessor, an indication from a host device that a memory cell of the memory array is defective, where identifying the new information for repairing the second defect is based on the indication, and where the new information for repairing the second defect includes an address associated with the memory cell.

The information programming component 520 may program, by the microprocessor, the information for repairing the defect of the memory array to a set of latches coupled with the memory array and on the same die as the memory array. In some examples, the information programming component 520 may program the new information for repairing the second defect to the set of latches. In some examples, the information programming component 520 may check, by the microprocessor, for errors associated with the information for repairing the defect, where programming the information for repairing the defect to the set of latches is based on the checking for errors.

The testing component 525 may cause the memory device 505 to modify a voltage or timing parameter associated with an access operation for a memory cell of the memory array. In some examples, the testing component 525 may cause the memory device 505 to access the memory cell using the modified voltage or timing parameter. In some examples, the testing component 525 may identify an error associated with the accessing, where the new information for repairing the second defect includes an address associated with the memory cell. In some examples, the testing component 525 or another component of the memory device 505 to may perform error checking on data obtained from a memory cell of the memory array. In some examples, the testing component 525 may determine, based on the error checking, that a quantity of errors associated with the memory cell satisfies a threshold. In some examples, the testing component 525 may determine that the memory cell is defective based on the quantity of errors, where the new information for repairing the second defect includes an address associated with the memory cell.

The memory repair component 530 may receive, after the information for repairing the defect is programmed to the set of latches, an address associated with an access command for one or more memory cells of the memory array. In some examples, the memory repair component 530 may compare the received address with the information programmed to the set of latches, where the information for repairing the defect includes an address of one or more defective memory cells of the memory array.

In some examples, the memory repair component 530 may determine, based on the comparing, a match between the received address and the information programmed to the set of latches. In some examples, the memory repair component 530 may cause the memory device 505 to activate, based on the match, a second set of one or more memory cells configured to replace a first set of one or more memory cells, where the first set of one or more memory cells correspond to the received address. In some examples, the memory repair component 530 may determine, based on the comparing, a mismatch between the received address and the information programmed to the set of latches. In some examples, the memory repair component 530 may cause the memory device 505 to activate a first set of one or more memory cells corresponding to the received address based on the mismatch.

In some examples, the boot component 535 may perform, by the microprocessor, a boot procedure for the die, where the identifying and programming are based on the boot procedure.

Figure 6:
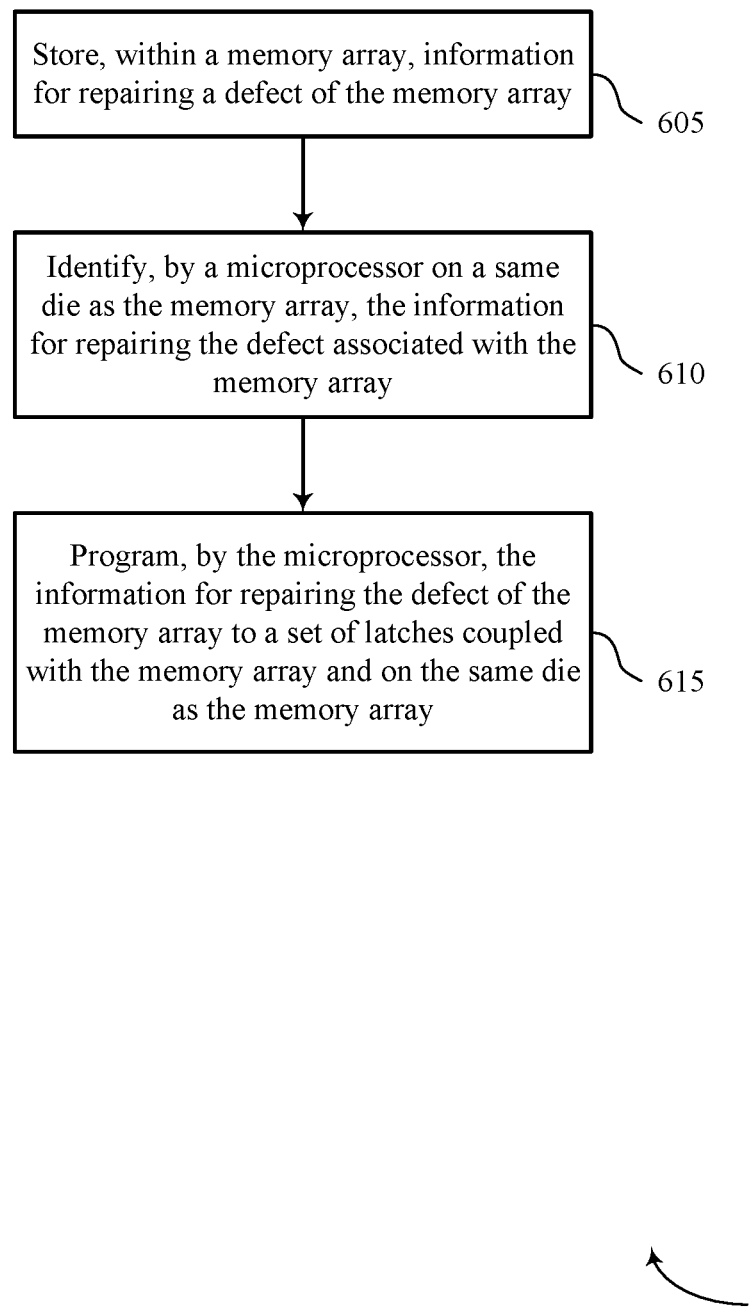
FIGS. 6 and 7 show flowcharts illustrating a method or methods that support modifiable repair solutions for a memory array in accordance with examples as disclosed herein.

FIG. 6 shows a flowchart illustrating a method or methods 600 that supports modifiable repair solutions for a memory array in accordance with examples as disclosed herein. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may store, within a memory array, information for repairing a defect of the memory array. For example, the memory device may write, to the memory array, the information for repairing the defect of the memory array. The operations of 605 may be performed according to the methods described with reference to FIGS. 3 and 4. In some examples, aspects of the operations of 605 may be performed by an information storage component as described with reference to FIG. 5.

At 610, the memory device may identify, by a microprocessor on a same die as the memory array, the information for repairing the defect associated with the memory array. For example, the memory device may read, from the memory array, and by the microprocessor on the same die as the memory array, the information for repairing the defect of the memory array. The operations of 610 may be performed according to the methods described with reference to FIGS. 3 and 4. In some examples, aspects of the operations of 610 may be performed by an information identification component as described with reference to FIG. 5.

At 615, the memory device may program, by the microprocessor, the information for repairing the defect of the memory array to a set of latches coupled with the memory array and on the same die as the memory array. The operations of 615 may be performed according to the methods described with reference to FIGS. 3 and 4. In some examples, aspects of the operations of 615 may be performed by an information programming component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for storing, within a memory array, information for repairing a defect of the memory array (e.g., writing, to the memory array, the information for repairing a defect of the memory array), identifying, by a microprocessor on a same die as the memory array, the information for repairing the defect associated with the memory array (e.g., reading, from the memory array, and by the microprocessor on the same die as the memory array, the information for repairing the defect of the memory array), and programming, by the microprocessor, the information for repairing the defect of the memory array to a set of latches coupled with the memory array and on the same die as the memory array.

Some examples of the method 600 and the apparatus described herein may further include operations, features, means, or instructions for identifying, by the microprocessor and after programming the information for repairing the defect to the set of latches, new information for repairing a second defect of the memory array, storing, within the memory array, the new information for repairing the second defect of the memory array, and programming the new information for repairing the second defect to the set of latches.

Some examples of the method 600 and the apparatus described herein may further include operations, features, means, or instructions for modifying a voltage or timing parameter associated with an access operation for a memory cell of the memory array, accessing the memory cell using the modified voltage or timing parameter, and identifying an error associated with the accessing, where the new information for repairing the second defect includes an address associated with the memory cell.

Some examples of the method 600 and the apparatus described herein may further include operations, features, means, or instructions for performing error checking on data obtained from a memory cell of the memory array, determining, based on the error checking, that a quantity of errors associated with the memory cell satisfies a threshold, and determining that the memory cell may be defective based on the quantity of errors, where the new information for repairing the second defect includes an address associated with the memory cell.

Some examples of the method 600 and the apparatus described herein may further include operations, features, means, or instructions for receiving, by the microprocessor, an indication from a host device that a memory cell of the memory array may be defective, where identifying the new information for repairing the second defect may be based on the indication, and where the new information for repairing the second defect includes an address associated with the memory cell.

Some examples of the method 600 and the apparatus described herein may further include operations, features, means, or instructions for checking, by the microprocessor, for errors associated with the information for repairing the defect, where programming the information for repairing the defect to the set of latches may be based on the checking for errors.

Some examples of the method 600 and the apparatus described herein may further include operations, features, means, or instructions for receiving, after programming the information for repairing the defect to the set of latches, an address associated with an access command for one or more memory cells of the memory array, and comparing the received address with the information programmed to the set of latches, where the information for repairing the defect includes an address of one or more defective memory cells of the memory array.

Some examples of the method 600 and the apparatus described herein may further include operations, features, means, or instructions for determining, based on the comparing, a match between the received address and the information programmed to the set of latches, and activating, based on the match, a second set of one or more memory cells configured to replace a first set of one or more memory cells, where the first set of one or more memory cells correspond to the received address.

Some examples of the method 600 and the apparatus described herein may further include operations, features, means, or instructions for determining, based on the comparing, a mismatch between the received address and the information programmed to the set of latches, and activating a first set of one or more memory cells corresponding to the received address based on the mismatch.

Some examples of the method 600 and the apparatus described herein may further include operations, features, means, or instructions for performing, by the microprocessor, a boot procedure for the die, where the identifying and programming may be based on the boot procedure.

Some examples of the method 600 and the apparatus described herein may further include operations, features, means, or instructions for storing, within the memory array, a second copy of the information for repairing the defect of the memory array.

Figure 7:
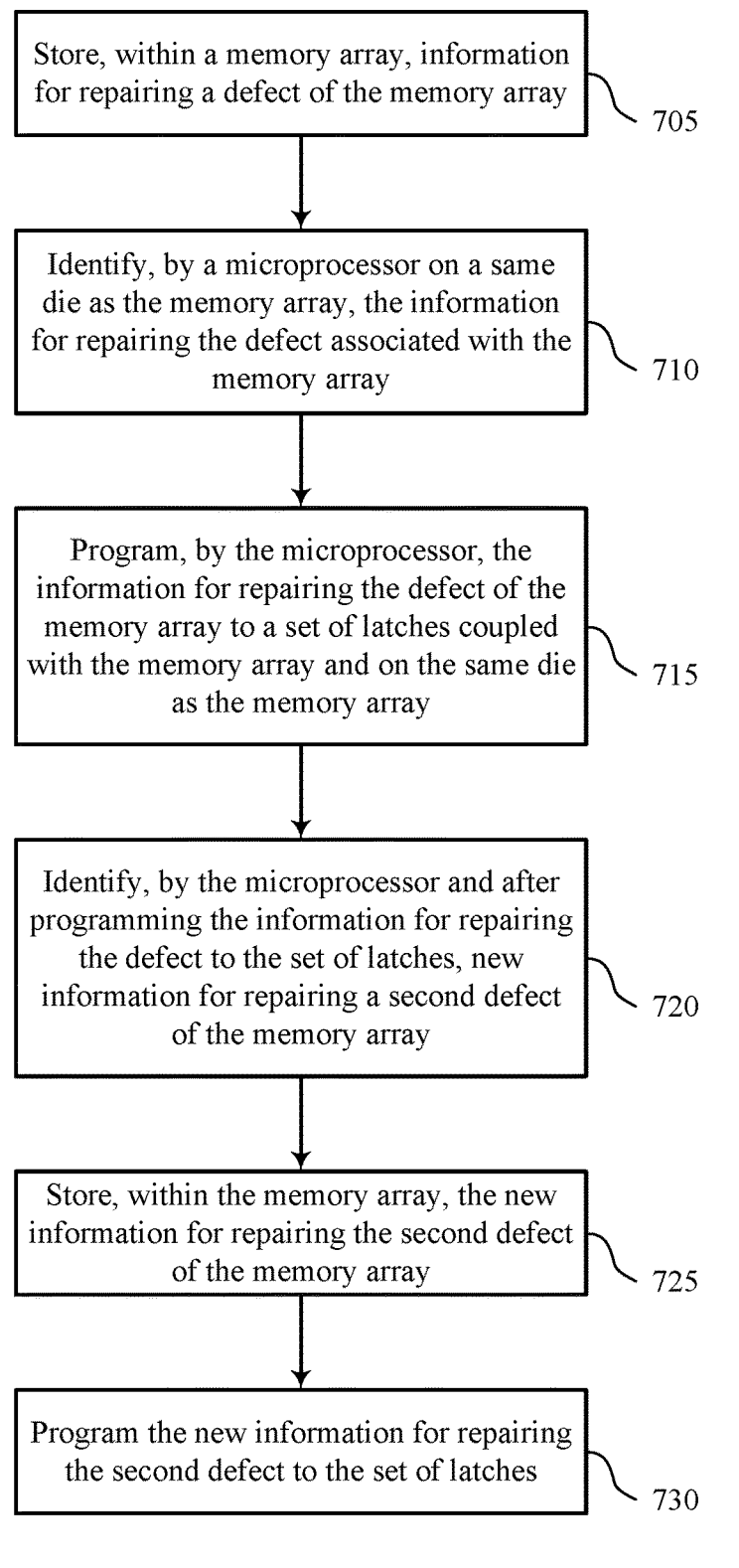

FIG. 7 shows a flowchart illustrating a method or methods 700 that supports modifiable repair solutions for a memory array in accordance with examples as disclosed herein. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the memory device may store, within a memory array, information for repairing a defect of the memory array. For example, the memory device may write, to the memory array, the information for repairing a defect of the memory array. The operations of 705 may be performed according to the methods described with reference to FIGS. 3 and 4. In some examples, aspects of the operations of 705 may be performed by an information storage component as described with reference to FIG. 5.

At 710, the memory device may identify, by a microprocessor on a same die as the memory array, the information for repairing the defect associated with the memory array. For example, the memory device may read, from the memory array, and by the microprocessor on the same die as the memory array, the information for repairing the defect of the memory array. The operations of 710 may be performed according to the methods described with reference to FIGS. 3 and 4. In some examples, aspects of the operations of 710 may be performed by an information identification component as described with reference to FIG. 5.

At 715, the memory device may program, by the microprocessor, the information for repairing the defect of the memory array to a set of latches coupled with the memory array and on the same die as the memory array. The operations of 715 may be performed according to the methods described with reference to FIGS. 3 and 4. In some examples, aspects of the operations of 715 may be performed by an information programming component as described with reference to FIG. 5.

At 720, the memory device may identify, by the microprocessor and after programming the information for repairing the defect to the set of latches, new information for repairing a second defect of the memory array. The operations of 720 may be performed according to the methods described with reference to FIG. 3. In some examples, aspects of the operations of 720 may be performed by an information identification component as described with reference to FIG. 5.

At 725, the memory device may store, within the memory array, the new information for repairing the second defect of the memory array. The operations of 725 may be performed according to the methods described with reference to FIG. 3. In some examples, aspects of the operations of 725 may be performed by an information storage component as described with reference to FIG. 5.

At 730, the memory device may program the new information for repairing the second defect to the set of latches. The operations of 730 may be performed according to the methods described with reference to FIGS. 3 and 4. In some examples, aspects of the operations of 730 may be performed by an information programming component as described with reference to FIG. 5.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a semiconductor die. The semiconductor die may include a memory array, a set of latches coupled with the memory array, and a microprocessor coupled with the memory array and with the set of latches. The microprocessor may be configured to obtain, from the memory array, information associated with a defect within the memory array, and program the information to the set of latches.

In some examples, the microprocessor may be further configured to identify, after programming the information to the set of latches, new information associated with a second defect within the memory array, store, within the memory array, the new information, and program the new information to the set of latches.

In some examples, the semiconductor die further may further include an access component configured to access memory cells of the memory array. The microprocessor may be configured to modify a voltage or timing parameter associated with an access operation by the access component and identify the new information associated with the second defect based at least in part on the access operation.

In some examples, the semiconductor die may further include an error correction component configured to perform error checking on data read from the memory array. The microprocessor may be further configured to identify the new information associated with the second defect based on one or more errors identified by the error correction component.

In some examples, the information associated with the defect may include an address of one or more defective memory cells of the memory array, the semiconductor die may further include a compare circuit coupled with the set of latches, the compare circuit configured to perform a comparison of an address associated with an access command for one or more memory cells of the memory array with the information programmed to the set of latches, the memory array may include a first set of memory cells and a second set of memory cells, the second set of memory cells configured to replace memory cells within the first set that may be identified as defective, and the semiconductor die may further include an access component coupled with the compare circuit and configured to access one or more memory cells of the second set based on the access command and the comparison.

In some examples, the semiconductor die may further include one or more pins, balls, or bond pads couplable with a source external to the semiconductor die. The memory array may be associated with a physical address space and with a logical address space for data received from the source external to the semiconductor die, and the physical address space may be larger than the logical address space. The microprocessor may be configured to obtain the information associated with the defect from a set of memory cells that may be outside the logical address space.

An apparatus is described. The apparatus may include a memory array on a die, a set of latches on the die and configured to store one or more addresses for memory cells within the memory array, first circuitry on the die and configured to indicate a match between a first address and an address stored by the set of latches, the first address associated with an access command for the memory array, second circuitry on the die and configured to access, in response to the access command, one or more memory cells having a second address based on the match between the first address and the address stored by the set of latches, and a microprocessor on the die. The microprocessor may be configured to obtain the one or more addresses from the memory array and write the one or more addresses to the set of latches.

In some examples, the microprocessor may be further configured to identify, after writing the one or more addresses to the set of latches, a defect associated with a memory cell within the memory array, and write an address for the memory cell to the set of latches.

In some examples, the memory array may include non-volatile (e.g., ferroelectric) memory cells, and the microprocessor may be configured to obtain and write the one or more addresses based on a boot event associated with the memory array.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a semiconductor die comprising:
a memory array operable to store information for repairing a defect within the memory array;
a set of latches coupled with the memory array; and
a microprocessor coupled with the memory array and with the set of latches, the microprocessor configured to:
obtain, from the memory array, the information for repairing the defect within the memory array; and
program the information to the set of latches.

2. The apparatus of claim 1, wherein the microprocessor is further configured to:
identify, after programming the information to the set of latches, new information associated with a second defect within the memory array;
store, within the memory array, the new information; and
program the new information to the set of latches.

3. The apparatus of claim 2, wherein the semiconductor die further comprises:
an access component configured to access memory cells of the memory array, wherein the microprocessor is configured to:
modify a voltage or timing parameter associated with an access operation by the access component; and
identify the new information associated with the second defect based at least in part on the access operation.

4. The apparatus of claim 2, wherein the semiconductor die further comprises:
an error correction component configured to perform error checking on data read from the memory array, wherein the microprocessor is further configured to identify the new information associated with the second defect based at least in part on one or more errors identified by the error correction component.

5. The apparatus of claim 1, wherein:
the information associated with the defect comprises an address of one or more defective memory cells of the memory array;
the semiconductor die further comprises a compare circuit coupled with the set of latches, the compare circuit configured to perform a comparison of an address associated with an access command for one or more memory cells of the memory array with the information programmed to the set of latches;
the memory array comprises a first set of memory cells and a second set of memory cells, the second set of memory cells configured to replace memory cells within the first set that are identified as defective; and the semiconductor die further comprises an access component coupled with the compare circuit and configured to access one or more memory cells of the second set based at least in part on the access command and the comparison.

6. The apparatus of claim 1, wherein the semiconductor die further comprises:
one or more pins, balls, or bond pads couplable with a source external to the semiconductor die, wherein:
the memory array is associated with a physical address space and with a logical address space for data received from the source external to the semiconductor die, the physical address space larger than the logical address space; and
the microprocessor is configured to obtain the information associated with the defect from a set of memory cells that is outside the logical address space.

7. An apparatus, comprising:
a memory array on a die and configured to store information for repairing a defect within the memory array, the information comprising one or more addresses for memory cells within the memory array;
a set of latches on the die and configured to store the one or more addresses;
a microprocessor on the die and configured to:
obtain the one or more addresses from the memory array; and
write the one or more addresses to the set of latches;
first circuitry on the die and configured to indicate a match between a first address and an address stored by the set of latches, the first address associated with an access command for the memory array; and
second circuitry on the die and configured to access, in response to the access command, one or more memory cells having a second address based at least in part on the match between the first address and the address stored by the set of latches.

8. The apparatus of claim 7, wherein the microprocessor is further configured to:
identify, after writing the one or more addresses to the set of latches, a second defect associated with a memory cell within the memory array; and
write an address for the memory cell to the set of latches.

9. The apparatus of claim 7, wherein:
the memory array comprises non-volatile memory cells; and
the microprocessor is configured to obtain and write the one or more addresses based at least in part on a boot event associated with the memory array.

10. A method, comprising:
storing, within a memory array, information for repairing a defect of the memory array;
identifying, by a microprocessor on a same die as the memory array, the information for repairing the defect of the memory array; and
programming, by the microprocessor, the information for repairing the defect of the memory array to a set of latches coupled with the memory array and on the same die as the memory array.

11. The method of claim 10, further comprising:
identifying, by the microprocessor and after programming the information for repairing the defect to the set of latches, new information for repairing a second defect of the memory array;
storing, within the memory array, the new information for repairing the second defect of the memory array; and
programming the new information for repairing the second defect to the set of latches.

12. The method of claim 11, further comprising:
modifying a voltage or timing parameter associated with an access operation for a memory cell of the memory array;
accessing the memory cell using the modified voltage or timing parameter; and
identifying an error associated with the accessing, wherein the new information for repairing the second defect comprises an address associated with the memory cell.

13. The method of claim 11, further comprising:
performing error checking on data obtained from a memory cell of the memory array;
determining, based at least in part on the error checking, that a quantity of errors associated with the memory cell satisfies a threshold; and
determining that the memory cell is defective based at least in part on the quantity of errors, wherein the new information for repairing the second defect comprises an address associated with the memory cell.

14. The method of claim 11, further comprising:
receiving, by the microprocessor, an indication from a host device that a memory cell of the memory array is defective, wherein identifying the new information for repairing the second defect is based at least in part on the indication, and wherein the new information for repairing the second defect comprises an address associated with the memory cell.

15. The method of claim 10, further comprising:
checking, by the microprocessor, for errors associated with the information for repairing the defect, wherein programming the information for repairing the defect to the set of latches is based at least in part on the checking for errors.

16. The method of claim 10, further comprising:
receiving, after programming the information for repairing the defect to the set of latches, an address associated with an access command for one or more memory cells of the memory array; and
comparing the received address with the information programmed to the set of latches, wherein the information for repairing the defect comprises an address of one or more defective memory cells of the memory array.

17. The method of claim 16, further comprising:
determining, based at least in part on the comparing, a match between the received address and the information programmed to the set of latches; and
activating, based at least in part on the match, a second set of one or more memory cells configured to replace a first set of one or more memory cells, wherein the first set of one or more memory cells correspond to the received address.

18. The method of claim 16, further comprising:
determining, based at least in part on the comparing, a mismatch between the received address and the information programmed to the set of latches; and
activating a first set of one or more memory cells corresponding to the received address based at least in part on the mismatch.

19. The method of claim 10, further comprising:
performing, by the microprocessor, a boot procedure for the die, wherein the identifying and programming are based at least in part on the boot procedure.

20. The method of claim 10, further comprising:
storing, within the memory array, a second copy of the information for repairing the defect of the memory array.

* * * * *